United States Patent
Yamamoto et al.

(10) Patent No.: US 8,373,231 B2
(45) Date of Patent: Feb. 12, 2013

(54) SEMICONDUCTOR DEVICE

(75) Inventors: Sukehiro Yamamoto, Chiba (JP);
Takeshi Koyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 549 days.

(21) Appl. No.: 12/709,762

(22) Filed: Feb. 22, 2010

(65) Prior Publication Data

US 2010/0213549 A1    Aug. 26, 2010

(30) Foreign Application Priority Data

Feb. 23, 2009  (JP) .................. 2009-039345
Jan. 28, 2010  (JP) .................. 2010-016340

(51) Int. Cl.
*H01L 23/62* (2006.01)
(52) U.S. Cl. ......... 257/355; 257/336; 257/335; 257/357
(58) Field of Classification Search .......... None
See application file for complete search history.

(56) References Cited

U.S. PATENT DOCUMENTS 6,927,458 B2 * 8/2005 Worley .......... 257/361
2009/0050968 A1 2/2009 Takasu et al.

FOREIGN PATENT DOCUMENTS

JP   07-045829 A   2/1995
JP   2007-116049 A   5/2007

OTHER PUBLICATIONS

Extended European Search Report for European Application No. 10154307.2, dated Sep. 19, 2011, 4 pages.

* cited by examiner

*Primary Examiner* — Kyoung Lee
(74) *Attorney, Agent, or Firm* — Brinks Hofer Gilson & Lione

(57) ABSTRACT

Provided is a semiconductor device including an n-type metal oxide semiconductor transistor for electrostatic discharge protection including drain regions and source regions placed alternately with each other, and gate electrodes each placed between each of the drain regions and each of the source regions, in which: the first metal interconnects formed on the source regions are electrically connected to the second metal interconnect through constant size via-holes, and a ratio between the numbers of the via-holes arranged above each of the source regions is controlled to be less than four according to a distance from the ground potential supply line.

12 Claims, 8 Drawing Sheets

SEMICONDUCTOR DEVICE

RELATED APPLICATIONS

This application claims priority under 35 U.S.C. §119 to Japanese Patent Application Nos. 2009-039345 filed on Feb. 23, 2009 and 2010-016340 filed on Jan. 28, 2010, the entire contents of which are hereby incorporated by reference.

BACKGROUND OF THE INVENTION

1. Field of the Invention

The present invention relates to a semiconductor device including a multi-finger type metal oxide semiconductor (MOS) transistor. In particular, the present invention relates to a semiconductor device using an n-type MOS (NMOS) transistor as an electrostatic discharge (hereinafter, referred to as ESD) protection element.

2. Description of the Related Art

In a semiconductor device including MOS transistors, an off transistor, which is an NMOS transistor provided in an off-state whose gate potential is fixed to a ground (Vss), is used as an ESD protection element for preventing breakdown of an internal circuit due to static electricity supplied from a pad provided for external connection.

Since the off transistor must flow a large amount of current generated by static electricity at once unlike ordinary MOS transistors forming an internal circuit such as a logic circuit, the off transistor is formed to have a large width (width W) of about several hundred micrometers in many cases.

Accordingly, the off transistor often takes a form of multi-finger which is obtained by combining a plurality of drain regions, source regions, and gate electrodes into a comb shape.

However, the combinatorial structure of a plurality of transistors causes a difficulty in uniformly operating the whole NMOS transistors for ESD protection. For example, current concentration occurs in a portion closer to the external connection terminal, resulting in the breakdown of the off transistor without sufficiently exhibiting the original ESD protection function.

As a countermeasure, there is proposed a method in which a distance between a contact hole formed on a drain region and a gate electrode is made smaller as a distance from the external connection terminal becomes longer to accelerate the operation of the transistor (for example, refer to FIG. 2 of JP 7-45829 A). There is also a proposal in which a length of a salicide block deposed on a drain region to protect the drain region from covering by the salicide is made longer as a distance from a substrate contact becomes longer to obtain a uniform operation of the transistor (for example, refer to JP 2007-116049 A).

When a width W is, for example, made smaller for a uniform operation of the off transistor, the protection function is, however, not sufficiently accomplished. Further, in the method of JP 7-45829 A, the distance between the contact and the gate electrode in the drain region is adjusted to thereby locally adjust a transistor operation speed. The method, however, has problems that a desired contact position cannot be ensured along with a reduction in width of the drain region, that line resistance has been made low through a use of an interconnect including a refractory metal in recent years to thereby accelerate the propagation speed of a surge, causing a case where the transistor operation speed cannot be adjusted only by the distance between the contact and the gate electrode, and that it is difficult to adapt the method to a case in which interconnect to the transistor is introduced from a direction perpendicular to the width direction of the transistor.

The patent document JP 2007-116049 A discloses a method for a local control of the operating speed of a transistor by adjusting the length of the salicide block on the drain region. The method, however, has problems that a predetermined length cannot be assured due to a variation caused in a manufacturing process, that line resistance has been made low through a use of an interconnect including a refractory metal in recent years to thereby accelerate the propagation speed of a surge, causing concentration of surges into a particular region of a salicide region, and that an occupation area by the NMOS off transistor increases due to an adjustment of the length of the salicide block.

SUMMARY OF THE INVENTION

In order to solve the aforementioned problems, a semiconductor device according to the present invention is structured as follows.

In a semiconductor device including an n-type metal oxide semiconductor transistor for electrostatic discharge protection, the n-type metal oxide semiconductor transistor has a structure in which a plurality of transistors is arranged with a plurality of drain regions and a plurality of source regions alternately placed with each other and also with a plurality of gate electrodes each placed between one of the plurality of drain regions and one of the plurality of source regions to be integrated to form a single transistor, the n-type metal oxide semiconductor transistor including: the plurality of drain regions electrically connected to an external connection terminal; the plurality of source regions electrically connected to a ground potential supply line; a first metal interconnect connected with the plurality of source regions, the first metal interconnect connected to a plurality of layers of metal interconnects other than the first metal interconnect; and via-holes disposed on the first metal interconnect and having a uniform size for electrically connecting the first metal interconnect and the plurality of layers of metal interconnects other than the first metal interconnect, the number of the via-holes disposed on the first metal interconnect getting greater as a distance of a interconnect connected to the n-type metal oxide semiconductor transistor from outside becoming larger.

Further, the plurality of layers of metal interconnects other than the first metal interconnect is introduced in a direction perpendicular to a channel width direction of the n-type metal oxide semiconductor transistor for electrostatic discharge protection, the first metal interconnect is placed in a direction parallel to the channel width direction of the n-type metal oxide semiconductor transistor for electrostatic discharge protection, and the plurality of layers of metal interconnects other than the first metal interconnect is connected to the first metal interconnect via the via-holes on the plurality of source regions.

Further, the via-holes are placed to be widely distributed in the direction parallel to the channel width direction of the n-type metal oxide semiconductor transistor for electrostatic discharge protection on the plurality of source regions.

Further, the via-holes are placed to be concentrated on a part of each of the plurality of source regions.

Alternatively, the number of the via-holes disposed for connecting the first metal interconnect and the plurality of layers of metal interconnects other than the first metal interconnect is controlled to have a ratio less than four due to the distance of a interconnect connected to the n-type metal oxide semiconductor transistor from outside.

As described above, according to the present invention, even in the case where the interconnect introduced to the n-type metal oxide semiconductor transistor for electrostatic discharge protection is introduced in the direction perpendicular to the channel width direction of the n-type metal oxide semiconductor transistor for electrostatic discharge protection using a high-speed multilayer interconnect including a refractory metal, employment of those means enables the interconnect to uniformly operate in the entire n-type metal oxide semiconductor transistor for electrostatic discharge protection.

Accordingly, the semiconductor device including the n-type metal oxide semiconductor transistor for electrostatic discharge protection provided with a sufficient electrostatic discharge protection function can be obtained.

DETAILED DESCRIPTION OF THE PREFERRED EMBODIMENTS

First Embodiment

Figure 1:
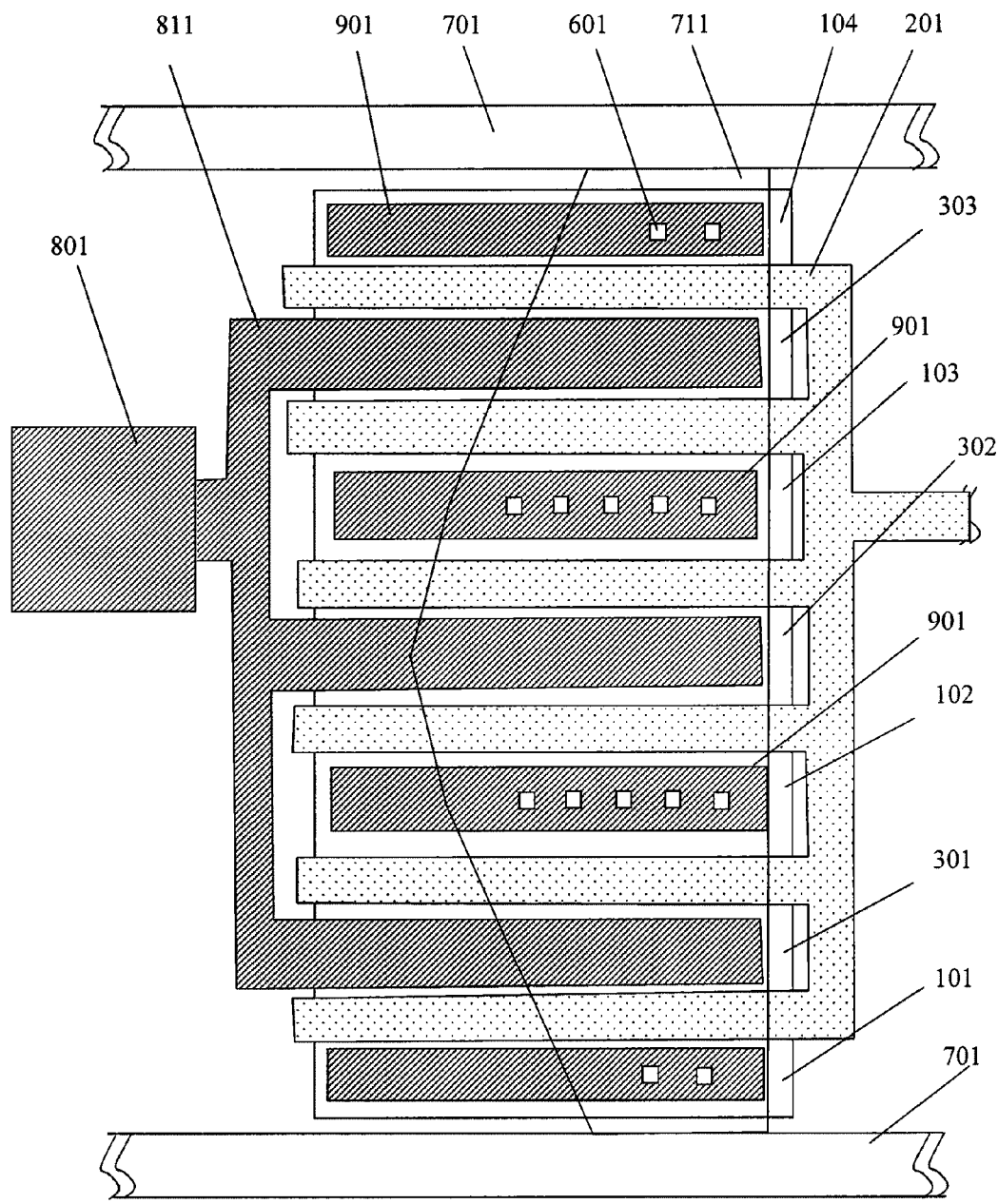
FIG. 1 is a schematic plan view showing an NMOS transistor for ESD protection of a semiconductor device according to a first embodiment of the present invention.

FIG. 1 is a schematic plan view showing an NMOS transistor for ESD protection of a semiconductor device according to a first embodiment of the present invention.

A first source region 101 and a first drain region 301 are formed of an n-type heavily-doped impurity region. Between the first source region 101 and the first drain region 301, a gate insulating film (not shown) made of a silicon oxide film or the like is formed, and a gate electrode 201 made of a polysilicon or the like are formed thereon. Arranging a mirror-reflected pattern repeatedly, there are formed a second source region 102 via the gate electrode 201 from the first drain region 301, the second drain region 302 via the gate electrode 201, and a third source region 103 via the gate electrode 201, the third drain region 303 via the gate electrode 201, and the fourth source region 104 via the gate electrode 201. The first embodiment shows an example in which four source regions, three drain regions, and six gate electrodes are placed to form a comb shape. As a MOS transistor, six transistors are combined.

In this case, a ground potential is supplied to the first source region 101, the second source region 102, the third source 103 and the fourth source region 104, by means of a second metal interconnect 711 which is formed of a material including a refractory metal and has a form of a wing and is connected to ground potential supply lines 701 which is arranged on both sides of the NMOS transistor and is formed of the metal material including the refractory metal and is formed of a wide interconnect having a low resistance. The second metal interconnect 711 is placed from the ground potential supply line 701 in a direction perpendicular to a channel width direction of the NMOS transistor for ESD protection, and is connected to a first metal interconnect 901 formed of the material including the refractory metal through the via-holes 601. Further, the first metal interconnect 901 is connected to the first source region 101, the second source region 102, the third source region 103 and the fourth source region 104 through contact holes though not shown for simplicity.

In this case, the number of via-holes 601 is set largest on the second source region 102 or the third source region 103 placed farthest from the ground potential supply line 701, and set smallest on the first source region 101 or the fourth source region 104 placed closest to the ground potential supply line 701.

When the number of via-holes is set appropriately, for each of the first source region 101, the second source region 102, the third source region 103, and the fourth source region 104, each sum of an line resistance of the second metal interconnect 711 connected to the ground potential supply line 701 and a contact resistance through the via-holes 601 arranged on each of the first metal interconnects formed on each of the source regions can be made substantially equal to one another, permitting a uniform operation in the entire NMOS transistor for ESD protection without concentrating to a part close to the ground potential supply line 701.

This embodiment shows a case where a width of the second metal interconnect 711 increases as a distance between the ground potential supply line 701 and the second metal interconnect 711 becomes larger, and with such a structure, an effect of the line resistance of the second metal interconnect 711 can be mitigated.

On the other hand, a first metal interconnect 811 made of the material including the refractory metal is connected to an external connection terminal 801 at one end, and is connected to the first drain region 301, the second drain region 302, and the third drain region 303 at the other end. The first drain region 301, the drain region 302, and the third drain region are connected to the first metal interconnect 811 via the contact holes, which is not shown in the drawing.

In the first embodiment shown by FIG. 1, the metal interconnect for supplying and fixing the potentials of the source regions of the NMOS transistor for ESD protection is set to be the second metal interconnect, and the interconnect connected to the drain regions is set to be the first metal interconnect. In contrast, the first metal interconnect may be the line for supplying and fixing the potentials of the source regions, the second metal interconnect may be the line connected to the drains, or a combination thereof may be conducted at will. In that case, it is essential that the correct number of via-holes, which are placed on a side where the second metal interconnect is used, should be assigned so that, according to the gist of the description of the first embodiment shown in FIG. 1, the sums of the line resistances in a metal interconnect connected to the plurality of source regions of the NMOS transistor for ESD protection and the resistance between the interconnects, in which the contact resistance of via-holes is included, are substantially equal.

The first embodiment shown by FIG. 1 shows an example in which two layers of metal interconnects are used, but a plurality of metal layers equal to or more than three layers may be used. In such a case, attention must be paid to the similar points as in the case of using two layers described above.

Second Embodiment

Figure 2:
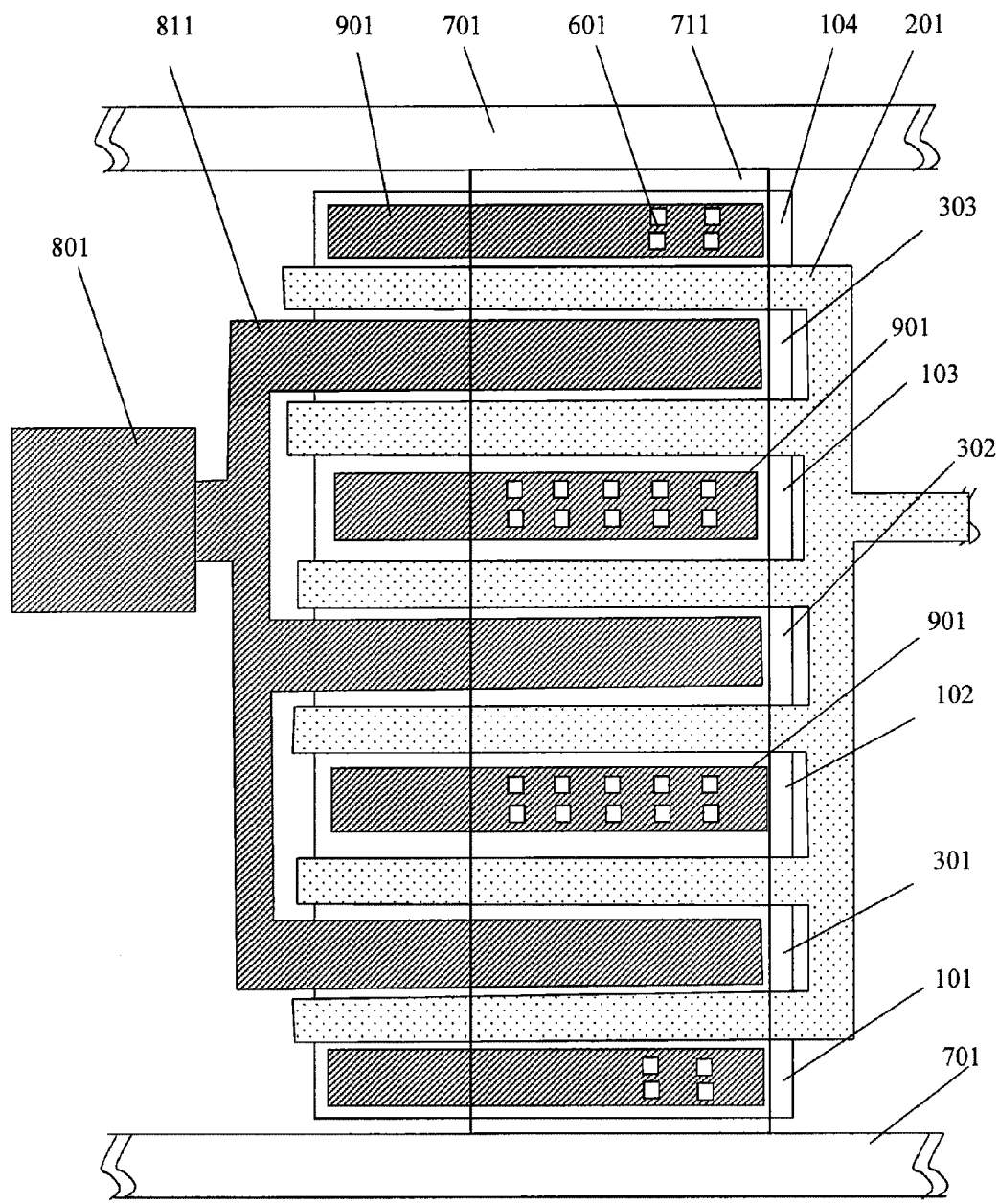
FIG. 2 is a schematic plan view showing an NMOS transistor for ESD protection of a semiconductor device according to a second embodiment of the present invention.

FIG. 2 is a schematic plan view showing an NMOS transistor for ESD protection of a semiconductor device according to a second embodiment of the present invention. Counterparts corresponding to the parts of FIG. 1 are denoted by the same reference numerals. The second embodiment is different from the first embodiment shown in FIG. 1 in an arrangement of the via-holes 601. In the first embodiment shown in FIG. 1, the via-holes 601 placed over the first source region 101, the second source region 102, and the third source region 103 are arranged to have a wide distribution in a direction parallel to the channel width direction of the NMOS transistor for ESD protection. On the other hand, in the second embodiment shown in FIG. 2, the via-holes 601 are placed to concentrate to a part above each of the first source region 101, the second source region 102, and the third source region 103.

This placement is a result of an attention paid to the connection of the first metal interconnects 811 to the first drain region 301, the second drain region 302, and the third drain region 303. Since the metal interconnects 811 coming from the external connection terminal 801 are introduced to the first drain region 301, the second drain region 302, and the third drain region 303 from one end of the first drain region 301, one end of the second drain region 302, and one end of the third drain region 303, respectively, the line resistance of the metal line 811 differs between a side close to and a side apart from the external connection terminal 801 in the channel width direction, making a portion of the first drain region 301, a portion of the second drain region 302, and a portion of the third drain region 303, which are closer to the external connection terminal 801, relatively easy to operate.

In view of this circumstance, it is aimed that, in the first source region 101, the second source region 102, and the third source region 103 which are paired with the first drain region 301, the second drain region 302, and the third drain region, respectively, and the fourth source region 104, the via-holes 601 are provided so as to be concentrated in regions apart from the external connection terminal 801, with the result that generation of distance dependence to the external connection terminal 801 in the channel width direction is mitigated during operation of the NMOS transistor for ESD protection.

The second embodiment of FIG. 2 shows an example in which the line for supplying and fixing the potentials of the source regions of the NMOS transistor for ESD protection is supposed to be the second metal interconnect, and the line connected to the drain regions is supposed to be the first metal interconnect. However, as in the example of FIG. 1, the first metal interconnect may be the line for supplying and fixing the potentials of the source regions, the second metal interconnect may be the line connected to the drain regions, or a combination thereof may be conducted at will.

In such a case, as in the example of FIG. 1, it is essential that the number of via-holes placed on the side where the second metal interconnect is used should be set so that, according to the gist of the description of the first embodiment shown in FIG. 1, the sums of the line resistance and the resistance between the interconnects, in which the contact resistance of via-holes is included, introduced to the plurality of source regions of the NMOS transistor for ESD protection and the resistances among the interconnects are substantially equal, and a plurality of metal interconnects equal to or more than three layers may be used. Explanations for other parts denoted by the same reference numerals as FIG. 1 are omitted.

Third Embodiment

Figure 3:
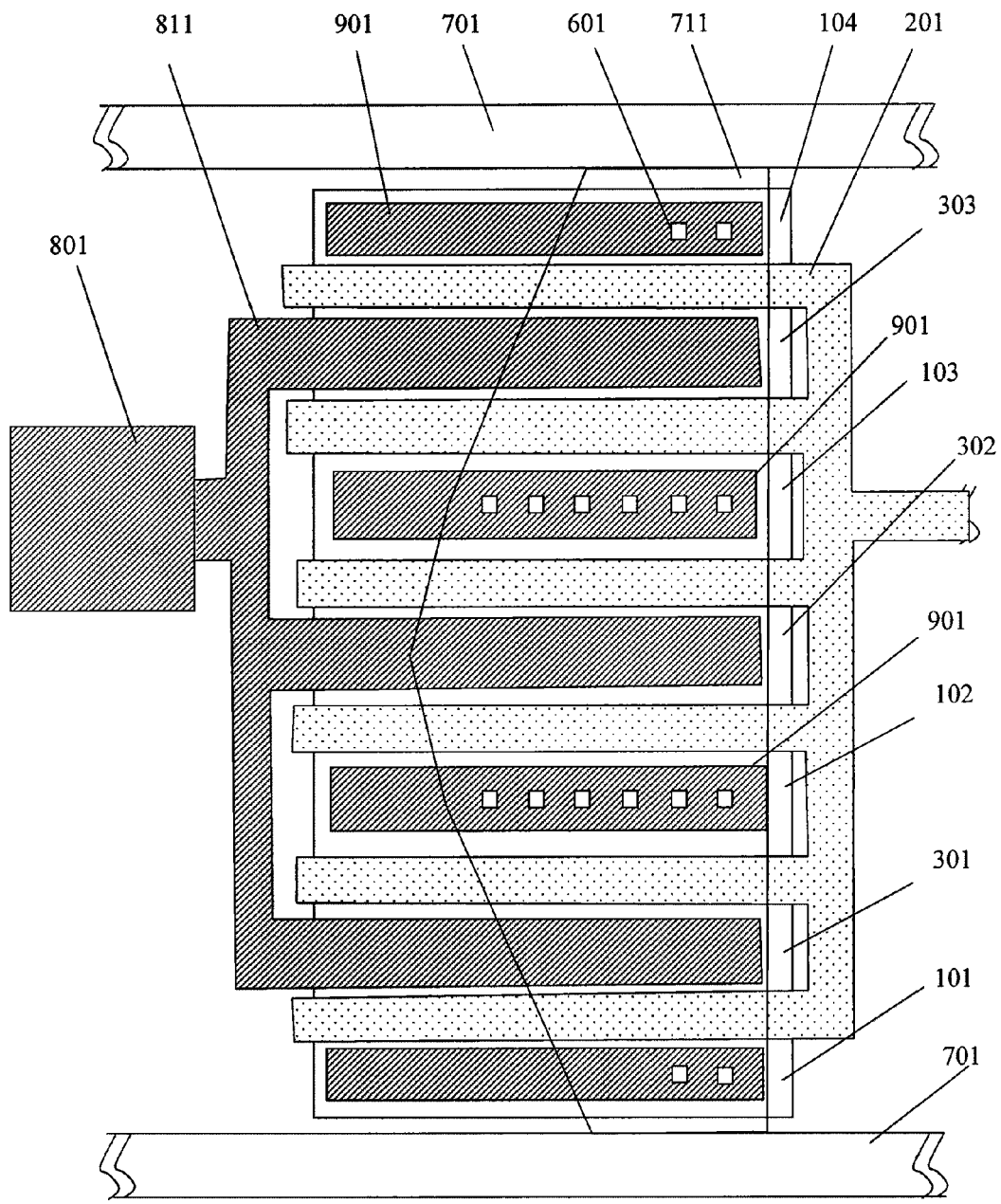
FIG. 3 is a schematic plan view showing an NMOS transistor for ESD protection of a semiconductor device according to a third embodiment of the present invention.

FIG. 3 is a schematic plan view showing an NMOS transistor for ESD protection of a semiconductor device according to a third embodiment of the present invention. Since the drawing resembles to the first embodiment shown in FIG. 1, explanations for the same points as in the first embodiment is omitted and explanations for different points from the first embodiment is given. The third embodiment is different from the first embodiment shown in FIG. 1 in an arrangement of the via-holes 601 to which explanation is given.

In the first embodiment the number of the via-holes 601 placed on the side where the second metal interconnect is used is controlled so that the sums of the line resistance and the resistance between the interconnects, in which the contact resistance of via-holes is included, introduced to the plurality of source regions of the NMOS transistor for ESD protection and the resistances among the interconnects are substantially equal, according to the gist of the description of the first embodiment shown in FIG. 1. Here an experimental result for the upper limit of the number of via-holes having a predetermined size is shown in FIG. 5.

Figure 5A:
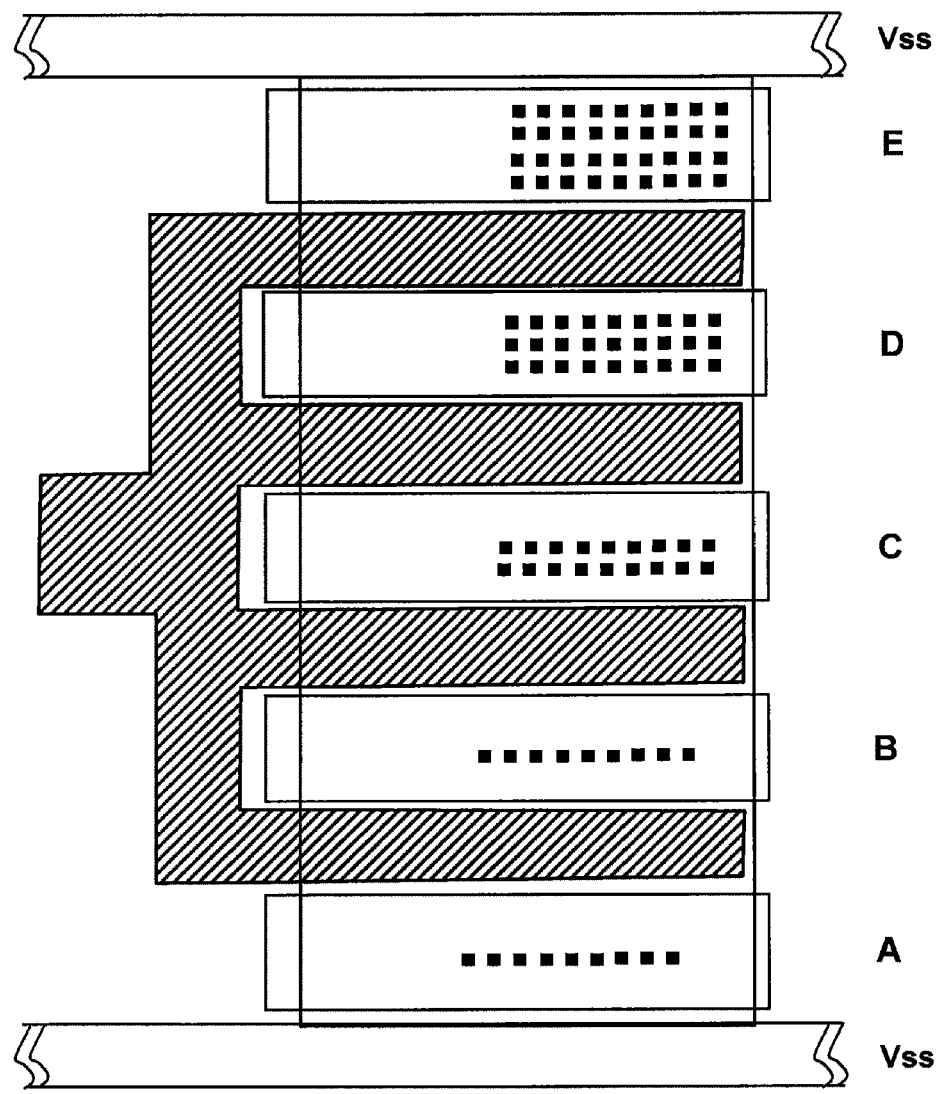
FIG. 5A is a schematic plan view showing an NMOS transistor for ESD protection used in an experiment for determining the most suitable number of via-holes.
Figure 5B:
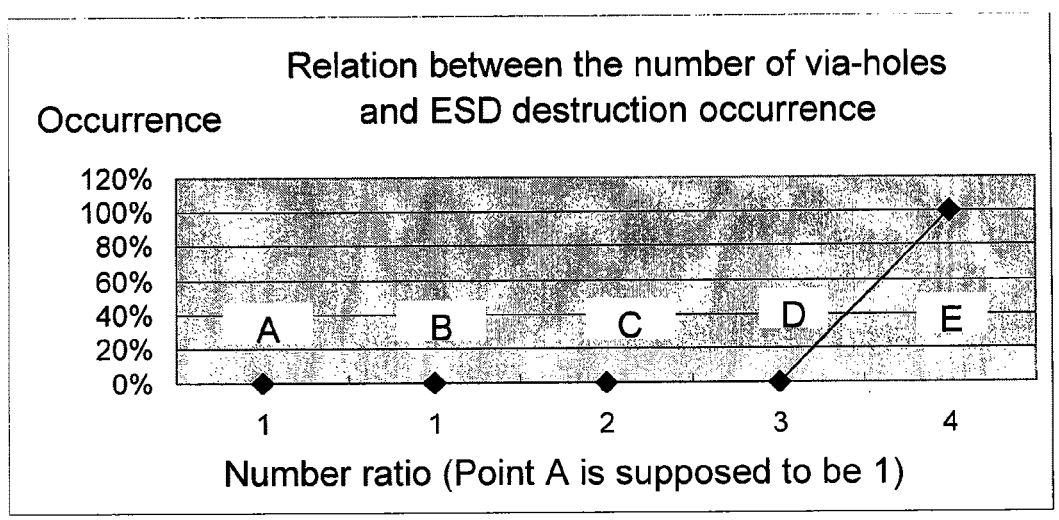
FIG. 5B is a diagram showing a percentage of breakdown events after pulses are applied till the breakdown occurs in a HMB mode ESD test.

FIG. 5 shows an experimental result for an optimum number for arrangement of via-holes for improving the ESD immunity. FIG. 5A shows a schematic plan view of a evaluation sample structure. All the via-holes have the same size. Gate electrodes and drain regions are omitted for simplicity. FIG. 5B shows an occurrence ratio of the number of destruction identified by photoemission after the pulses were applied to the evaluation sample until destruction occurs under an HMB mode ESD test. The numbers 1, 1, 2, 3, and 4 appearing along the horizontal axis are rations for the number of via-holes at each point against the point A, and each corresponding to the point A, point B, point C, point D, and point E, respectively. From the experiment it can be seen that frequent ESD destruction occurs at the point E where the via-hole number ratio is four times more though the distance from the ground potential supply line is the same for the point A and point E.

The result shows that it is important to set the number of via-holes placed on the second source region 102 and the third source region 103 which are disposed farthest from the ground potential supply line 701 less than four times of the number of via-holes placed on the first source region 101 and the fourth source region 104 which are disposed nearest to the ground potential supply line 701. Accordingly in a case where the number of fingers increases to extend the transistor width W, uniform operation in the whole of the NMOS transistor for ESD protection can be made by setting the number of via-holes placed on the source region which is disposed farthest from the ground potential supply line less than four times of the number of via-holes placed on the source region which is disposed nearest to the ground potential supply line.

Fourth Embodiment

Figure 4:
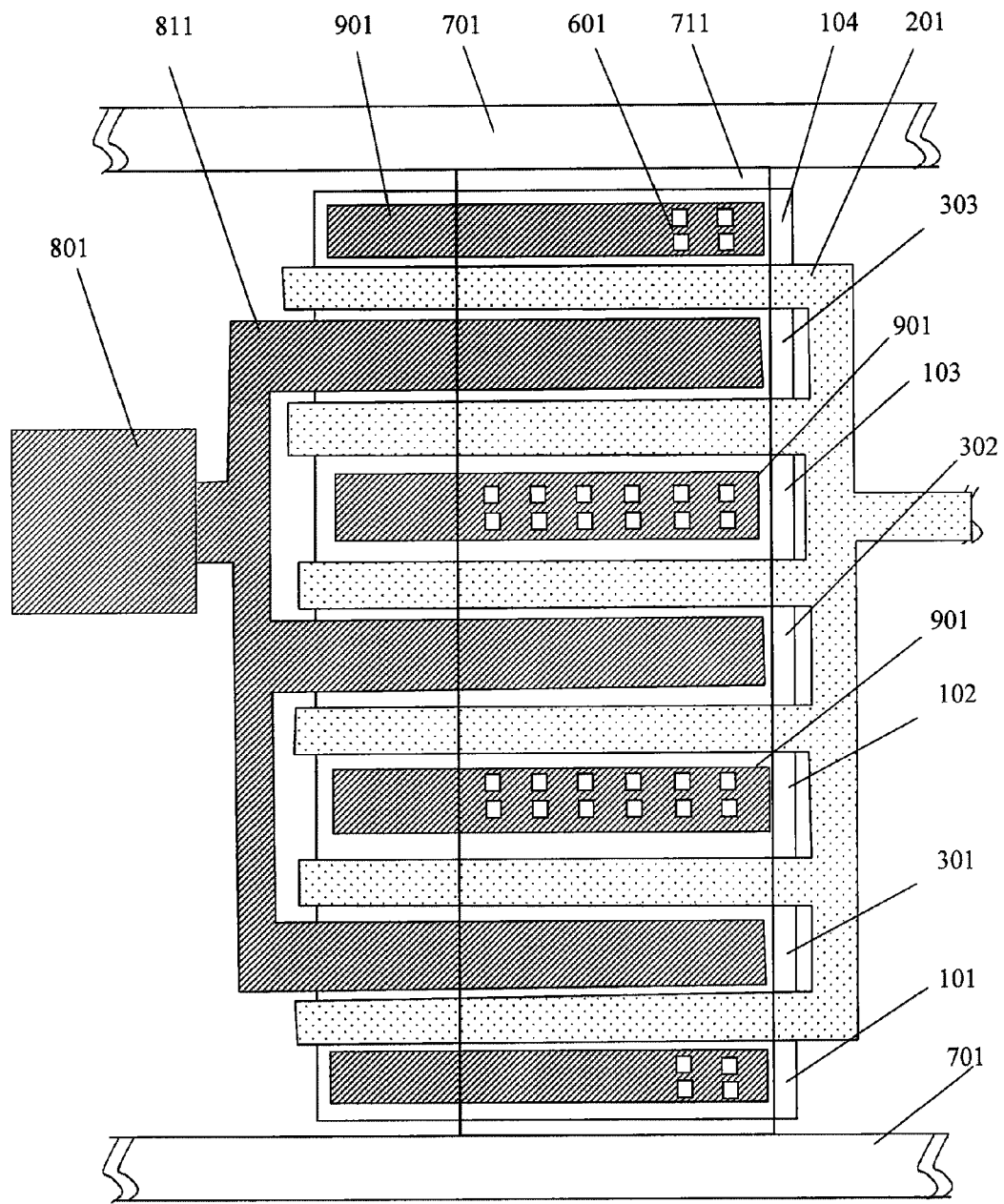
FIG. 4 is a schematic plan view showing an NMOS transistor for ESD protection of a semiconductor device according to a fourth embodiment of the present invention.

FIG. 4 is a schematic plan view showing an NMOS transistor for ESD protection of a semiconductor device according to a fourth embodiment of the present invention. In this embodiment the second embodiment and the third embodiment are combined. Though a detailed explanation is omitted, it is seen easily that in a case where the number of fingers increases to extend the transistor width W, uniform operation in the whole of the NMOS transistor for ESD protection can be made by setting the number of via-holes placed on the source region which is disposed farthest from the ground potential supply line 701 less than four times of the number of via-holes placed on the source region which is disposed nearest to the ground potential supply line 701.

Fifth Embodiment

Figure 6:
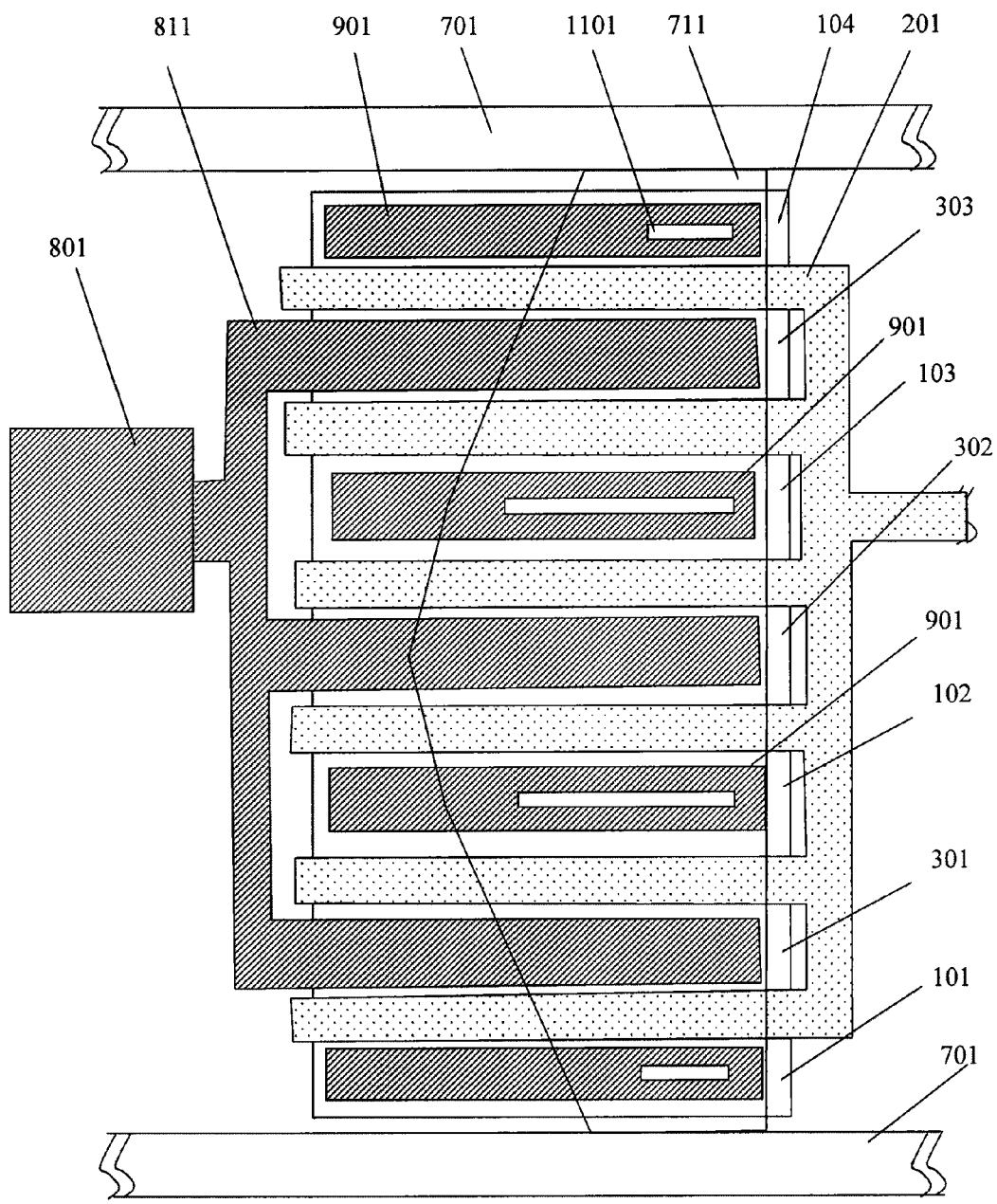
FIG. 6 is a schematic plan view showing an NMOS transistor for ESD protection of a semiconductor device according to a fifth embodiment of the present invention.

FIG. 6 is a schematic plan view showing an NMOS transistor for ESD protection of a semiconductor device according to a fifth embodiment of the present invention. Counterparts corresponding to the parts of FIG. 1 are denoted by the same reference numerals. The fifth embodiment is different from the first embodiment shown in FIG. 1 in an arrangement of the linear via-holes 1101 having a constant width and a different length above the each source region.

Accordingly, arranging linear via-holes 1101 instead of via-holes 601, increase in the contact area with the first metal interconnect eases realization of low resistance connection, permitting a higher propagation speed of the ESD surge for faster conduction and easier operation while holding features described in the first embodiment.

Sixth Embodiment

Figure 7:
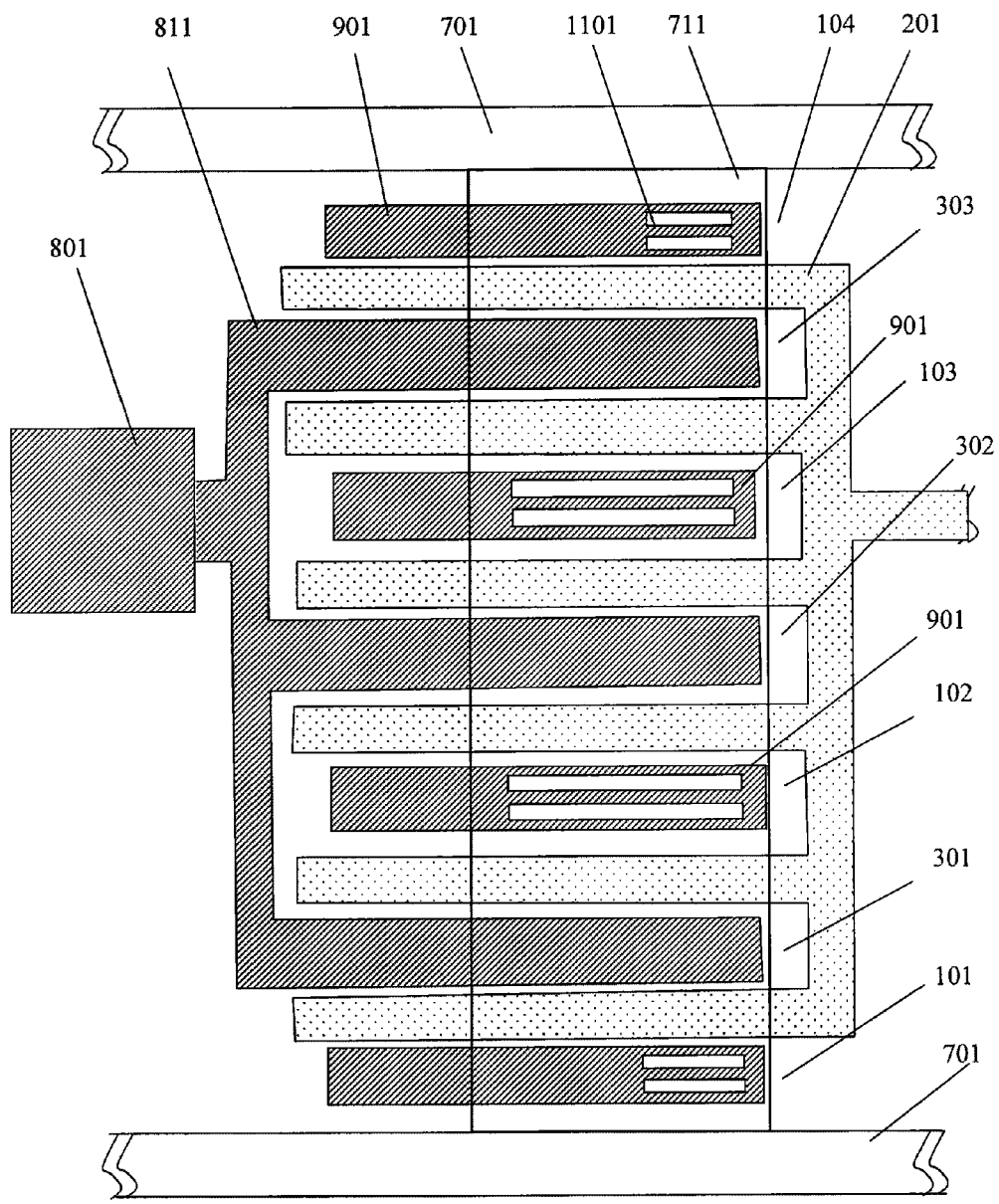
FIG. 7 is a schematic plan view showing an NMOS transistor for ESD protection of a semiconductor device according to a sixth embodiment of the present invention.

FIG. 7 is a schematic plan view showing an NMOS transistor for ESD protection of a semiconductor device according to a sixth embodiment of the present invention. Counterparts corresponding to the parts of FIG. 2 are denoted by the same reference numerals. The sixth embodiment is different from the second embodiment shown in FIG. 2 in an arrangement of the linear via-holes 1101 having a constant width and a different length above the each source region.

Accordingly, arranging linear via-holes 1101 instead of via-holes 601, increase in the contact area with the first metal interconnect eases realization of low resistance connection, permitting a higher propagation speed of the ESD surge for faster conduction and easier operation while holding features described in the first embodiment.

What is claimed is:

1. A semiconductor device comprising:
   an n-type metal oxide semiconductor transistor for electrostatic discharge protection having a multi-finger structure in which a plurality of transistors is integrated, and comprising a plurality of drain regions and a plurality of source regions alternately placed with each other, and a plurality of gate electrodes each placed between each of the plurality of drain regions and each of the plurality of source regions;
   wherein the plurality of drain regions is electrically connected to an external connection terminal;
   wherein the plurality of source regions is electrically connected to a ground potential supply line through first metal interconnects disposed above and connected to each of the plurality of source regions, and a second metal interconnect connected to each of the first metal interconnects with via-holes having a constant size and placed on each of the first metal interconnects; and
   wherein a number of the via-holes placed on the first metal interconnect becomes larger as a distance from the ground potential supply line becomes farther.

2. A semiconductor device according to claim 1:
   wherein the second metal interconnect is introduced along a direction perpendicular to a channel width direction of the n-type metal oxide semiconductor transistor for electrostatic discharge protection;
   wherein the first metal interconnects are placed in a direction parallel to the channel width direction of the n-type metal oxide semiconductor transistor for electrostatic discharge protection; and
   wherein the second metal interconnect are connected to each of the first metal interconnects via the via-holes disposed above the plurality of source regions.

3. A semiconductor device according to claim 1, wherein a number ratio of via-holes placed on one of the plurality of source region which is disposed farthest from the ground potential supply line to via-holes placed on another one of the source region which is disposed nearest to the ground potential supply line is less than four.

4. A semiconductor device according to claim 1, wherein the first metal interconnects and the second metal interconnect include a refractory metal.

5. A semiconductor device according to claim 2, wherein the via-holes are placed widely in a direction parallel to the channel width direction on the first metal interconnect disposed above and connected to each of the plurality of source regions.

6. A semiconductor device according to claim 2, wherein the via-holes are placed to concentrate in a portion of each of the first metal interconnects disposed above and connected to each of the plurality of source regions.

7. A semiconductor device according to claim 5, wherein a number ratio of via-holes placed on one of the plurality of source region which is disposed farthest from the ground potential supply line to via-holes placed on another one of the source region which is disposed nearest to the ground potential supply line is less than four.

8. A semiconductor device comprising:
   an n-type metal oxide semiconductor transistor for electrostatic discharge protection having a multi-finger structure in which a plurality of transistors is integrated, and comprising a plurality of drain regions and a plurality of source regions alternately placed with each other, and a plurality of gate electrodes each placed between each of the plurality of drain regions and each of the plurality of source regions;
   wherein the plurality of drain regions is electrically connected to an external connection terminal;
   wherein the plurality of source regions is electrically connected to a ground potential supply line through each of first metal interconnects disposed above and connected to each of the plurality of source regions, and a second metal interconnect connected to the first metal interconnects with via-holes having a constant size and placed on the first metal interconnects; and
   wherein each resistance obtained by adding a line resistance of the second metal interconnect connected the ground potential supply line and a contact resistance by the via-holes are substantially equal one another for each of the plurality of source regions.

9. A semiconductor device according to claim 8, wherein the via-holes have a constant size, and a number of the via-holes arranged on the first metal interconnects is controlled to substantially equalize the each resistance one another.

10. A semiconductor device according to claim 8, wherein the via-holes have a constant width, and a length of each of the via-holes arranged on the first metal interconnects is controlled to substantially equalize the each resistance one another.

11. A semiconductor device according to claim 8, wherein the second metal interconnect has a wider width in a direction parallel to a width of the NMOS transistor for ESD protection as a distance from the ground potential supply line is farther.

12. A semiconductor device comprising:
- an n-type metal oxide semiconductor transistor for electrostatic discharge protection having a multi-finger structure in which a plurality of transistors is integrated, and comprising a plurality of drain regions and a plurality of source regions alternately placed with each other, and a plurality of gate electrodes each placed between each of the plurality of drain regions and each of the plurality of source regions;
- wherein the plurality of drain regions is electrically connected to an external connection terminal;
- wherein the plurality of source regions is electrically connected to a ground potential supply line through each of first metal interconnects disposed above and connected to each of the plurality of source regions, and a second metal interconnect connected to the first metal interconnects with via-holes having a constant width and placed on the first metal interconnects; and
- wherein a length of each of the via-holes arranged on the first metal interconnects becomes longer as a distance from the ground potential supply line becomes farther.

* * * * *